United States Patent
Taniguchi

(10) Patent No.: US 8,120,447 B2
(45) Date of Patent: Feb. 21, 2012

(54) MULTILAYER BALANCED FILTER

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/070,553

(22) Filed: Mar. 24, 2011

(65) Prior Publication Data

US 2011/0169586 A1 Jul. 14, 2011

Related U.S. Application Data

(63) Continuation of application No. PCT/JP2009/065572, filed on Sep. 7, 2009.

(30) Foreign Application Priority Data

Nov. 11, 2008 (JP) .................................. 2008-289159

(51) Int. Cl.
*H03H 7/00* (2006.01)
(52) U.S. Cl. .......................................... 333/185; 333/26
(58) Field of Classification Search .................. 333/185, 333/204, 26
See application file for complete search history.

(56) References Cited

U.S. PATENT DOCUMENTS

| | | | |
|---|---|---|---|
| 5,668,511 A * | 9/1997 | Furutani et al. ................ | 333/204 |
| 6,417,745 B1 * | 7/2002 | Taniguchi ...................... | 333/185 |
| 6,768,399 B2 * | 7/2004 | Uriu et al. ...................... | 333/204 |
| 2002/0063611 A1 | 5/2002 | Tojyo et al. | |
| 2006/0273870 A1 * | 12/2006 | Yeung et al. ................... | 333/204 |
| 2007/0146101 A1 * | 6/2007 | Matsubara et al. ............ | 333/204 |
| 2007/0152780 A1 * | 7/2007 | Liao et al. ...................... | 333/204 |

FOREIGN PATENT DOCUMENTS

| | | |
|---|---|---|
| JP | 7-38368 A | 2/1995 |
| JP | 7-202616 A | 8/1995 |
| JP | 9-205018 A | 8/1997 |
| JP | 2005-45447 A | 2/2005 |
| JP | 2005-159514 A | 6/2005 |
| JP | 2006-25237 A | 1/2006 |
| JP | 2007-305861 A | 11/2007 |

OTHER PUBLICATIONS

Official Communication issued in International Patent Application No. PCT/JP2009/065572, mailed on Oct. 6, 2009.

* cited by examiner

*Primary Examiner* — Seungsook Ham
(74) *Attorney, Agent, or Firm* — Keating & Bennett, LLP

(57) ABSTRACT

A multilayer balanced filter includes a first coil including a first straight line electrode and via electrodes. A first capacitor, a second capacitor, and a third capacitor are provided respectively between a ground electrode and a first capacitor electrode, between the ground electrode and a second capacitor electrode, and between the ground electrode and a third capacitor electrode. The first coil and the first capacitor constitute an LC resonator. A second straight line electrode is arranged in parallel or substantially in parallel with the first straight line electrode, and a second coil and a third coil, each having a loop plane perpendicular or substantially perpendicular to the loop plane of the first coil, are provided. A second capacitor and a third capacitor are respectively connected between balanced output terminals and the ground.

6 Claims, 11 Drawing Sheets

FIG. 5A1
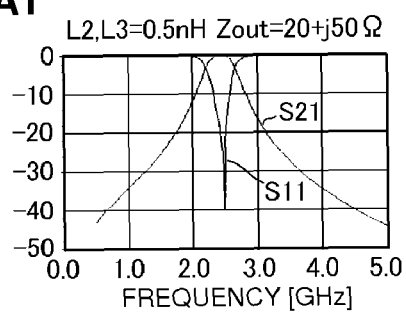
FIG. 5B1
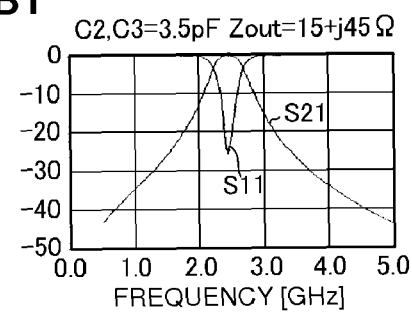
FIG. 5A2
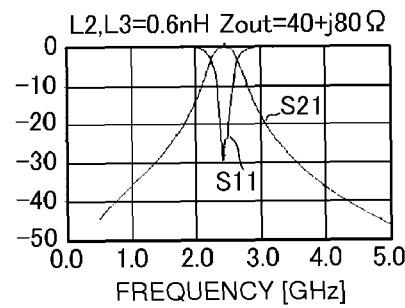
FIG. 5B2
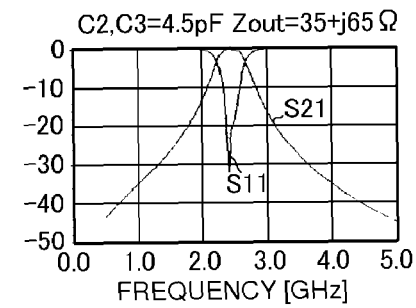
FIG. 5A3
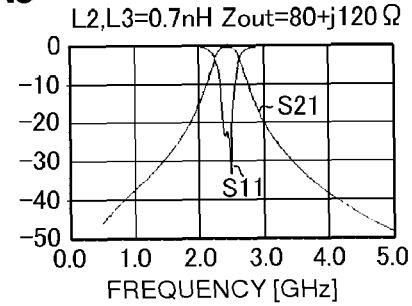
FIG. 5B3
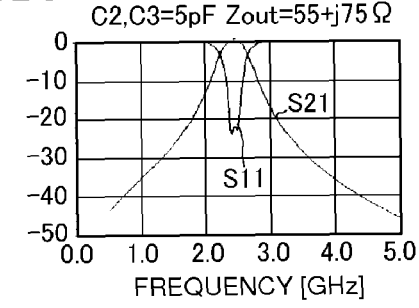

MULTILAYER BALANCED FILTER

BACKGROUND OF THE INVENTION

1. Field of the Invention

The present invention relates to a multilayer balanced filter including a stack including a plurality of dielectric layers and electrode layers.

2. Description of the Related Art

A typical conventional band pass filter whose size and cost can be easily reduced is formed by providing a plurality of LC resonance circuits within a stack including dielectric layers and electrode layers.

Such a multilayer band pass filter is disclosed in Japanese Unexamined Patent Application Publication No. 2005-45447.

The configuration of a multilayer band pass filter disclosed in Japanese Unexamined Patent Application Publication No. 2005-45447 is described with reference to FIG. 1.

FIG. 1 is a circuit diagram of the multilayer band pass filter disclosed in Japanese Unexamined Patent Application Publication No. 2005-45447. The multilayer band pass filter 1 includes an unbalanced input terminal 2, balanced output terminals 3A and 3B, and a band pass filter portion 4 provided between the unbalanced input terminal 2 and the balanced output terminals 3A and 3B. The band pass filter portion 4 is constituted by three resonators 40 arranged in a line, where each oscillator is a ½-wavelength resonator 40 whose both ends are open. The resonator 40 arranged at a position closest to the unbalanced input terminal 2 among the three resonators 40 is an input resonator 40I. The input resonator 40I is directly connected to the unbalanced input terminal 2. The resonator 40 arranged at a position closest to the balanced output terminals 3A and 3B is a balanced output ½-wavelength resonator 41A. The balanced output ½-wavelength resonator 41A is connected to the balanced output terminals 3A and 3B. The input resonator 40I is electromagnetically coupled with an intermediate resonator 40M, and the intermediate resonator 40M is also electromagnetically coupled with the balanced output ½-wavelength resonator 41A. The open ends of the three resonators 40 are connected to the ground by capacitors C.

In the multilayer band pass filter disclosed in Japanese Unexamined Patent Application Publication No. 2005-45447, a balanced-unbalanced conversion function and filter characteristics are realized by arranging a plurality of ½-wavelength resonators having open ends on the same surface of a substrate and thereby coupling the resonators with one another.

In the case of a filter having a balanced-unbalanced conversion function, the balanced terminals thereof are generally often connected to an IC which performs balanced input/output of signals. In this case, impedance conversion is required between the unbalanced terminal and the balanced terminals. However, the structure described in Japanese Unexamined Patent Application Publication No. 2005-45447 does not allow for easy design and adjustment for appropriate impedance conversion between these two types of terminals.

Further, even when a circuit for impedance conversion is provided, an additional area corresponding to the impedance conversion circuit portion is required, thereby preventing general reduction in size.

SUMMARY OF THE INVENTION

Preferred embodiments of the present invention solve the above problems and provide a multilayer balanced filter whose size can be easily reduced and which can realize specified impedance conversion between the input and output thereof.

According to a preferred embodiment of the present invention, a multilayer balanced filter includes a stack including a plurality of electrode layers, a plurality of dielectric layers provided among the plurality of electrode layers, and vertical conduction electrodes arranged in a stacking direction of the electrode layers; wherein the plurality of electrodes includes a first straight line electrode and a second straight line electrode, each having a substantially straight-line shape, arranged in parallel or substantially in parallel with each other, and the first straight line electrode and the vertical conduction electrodes connected to both ends of the first straight line electrode constitute a first coil; the plurality of electrode layers include a ground electrode and a first capacitor electrode, a second capacitor electrode, and a third capacitor electrode, each facing the ground electrode, and the ground electrode and the first capacitor electrode constitute a first capacitor, the ground electrode and the second capacitor electrode constitute a second capacitor, and the ground electrode and the third capacitor electrode constitute a third capacitor; the vertical conduction electrode connected to a first end of the first straight line electrode is connected to the first capacitor electrode, the vertical conduction electrode connected to a second end of the first straight line electrode is connected to the ground electrode such that an LC parallel resonator is defined by the first coil and the first capacitor; a second coil is connected to a first end of the second straight line electrode via the vertical conduction electrode, and a third coil is connected to a second end of the second straight line electrode via the vertical conduction electrode; a second end of the second coil is connected to the second capacitor electrode such that an LC parallel resonator is provided, and a second end of the third coil is connected to the third capacitor electrode such that an LC parallel resonator is provided; and the LC parallel resonator including the first coil is connected to an unbalanced terminal, the second end of the second coil and the second end of the third coil are respectively connected to balanced terminals, the LC parallel resonator including the first coil defines a loop of electrodes when viewed in a direction perpendicular or substantially perpendicular to the stacking direction of the stack, and each of the LC parallel resonator including the second coil and the LC parallel resonator including the third coil defines a loop of electrodes when viewed in the stacking direction of the stack.

With this unique configuration, balanced-unbalanced conversion is performed by using the coupling between the first straight line electrode and the second straight line electrode, and impedance conversion is performed by the second coil, the third coil, the second capacitor, and the third capacitor. Further, a plurality of LC parallel resonators constituted by the first to third capacitors, the first to third coils, and the second straight line electrode function as band pass filters.

Preferably, the first straight line electrode and the second straight line electrode are disposed on different layers.

This allows the strength of coupling between the first straight line electrode and the second straight line electrode to be increased. In addition, the relative positions of the first straight line electrode and the second straight line electrode can be easily changed, whereby the freedom of design regarding the strength of coupling is increased.

The first straight line electrode and the second straight line electrode may preferably be arranged such that one overlaps the other at least partially in plan view.

This structure allows the strength of coupling between the first straight line electrode and the second straight line electrode to be increased and the width of the passband to be increased.

The plurality of electrode layers may preferably include a power feeding terminal extension electrode connected to the second straight line electrode.

This allows a dc source voltage to be applied to an IC connected to the balanced terminals. Specifically, by providing the first straight line electrode and the second straight line electrode on different layers, and providing the power feeding terminal extension electrode on the layer having the second straight line electrode provided thereon, a power feeding terminal for dc feeding can be easily provided without using a special dielectric layer.

The ground electrode is preferably arranged between a group of the second and third capacitor electrodes and a group of the second and third coils.

This makes it possible to design the second and third capacitor electrodes and design the second and third coils separately and hence easily. In addition, the ground electrode can be commonly used among the first, second, and third capacitors, thereby realizing a decrease in the number of ground electrodes, leading to a lower height of the stack.

Each of the second coil and the third coil may preferably be constituted by coil portions respectively provided on a plurality of the electrode layers and the vertical conduction electrode, and the second and third coils may preferably have opposite winding directions and helical shapes, and preferably may substantially be line-symmetrically arranged.

This structure allows the inductances of the second and third coils to be set within a wide range. Hence, the impedance on the balanced side can be determined over a wide range. In addition, by making the coils have opposite winding directions and substantially be arranged line-symmetrically, the difference in amplitude between the balanced output terminals can be decreased.

According to various preferred embodiments of the present invention, a multilayer balanced filter can be provided that is small in size and realizes predetermined impedance conversion between the input and output thereof.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A1-5B3 illustrates the relationships among output impedances, attenuation characteristics, and reflection characteristics for settings of inductors L2 and L2, capacitors C2 and C3 on the balanced side.

DETAILED DESCRIPTION OF THE PREFERRED EMBODIMENTS

First Preferred Embodiment

A multilayer balanced filter according to a first preferred embodiment will be described with reference to FIGS. 2 to 7D.

Figure 2:
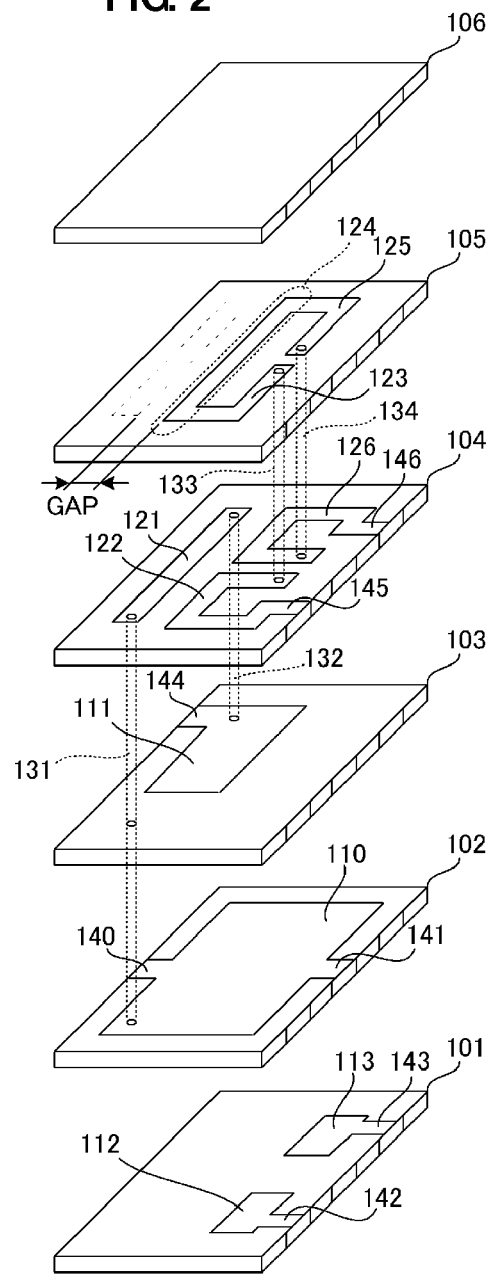
FIG. 2 is an exploded perspective view of a multilayer balanced filter according to a first preferred embodiment of the present invention.
Figure 3:
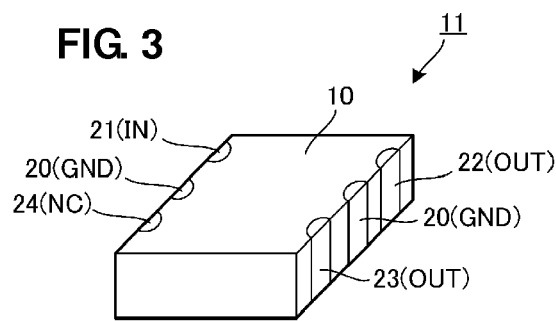
FIG. 3 is an external perspective view the multilayer balanced filter according to the first preferred embodiment of the present invention.

FIG. 2 is an exploded perspective view of the multilayer balanced filter according to the first preferred embodiment, and FIG. 3 is an external perspective view thereof.

Referring to FIG. 2, this multilayer balanced filter is preferably configured as a stack including a plurality of dielectric layers 101 to 106 each having predetermined electrode patterns provided thereon. Hence, this stack is constituted by a stack including dielectric layers and electrode layers.

A dielectric layer 103 includes a first capacitor electrode 111 provided thereon. The first capacitor electrode 111 extends to the left side of the dielectric layer 103 via an extension electrode 144. A dielectric layer 102 includes a ground electrode 110 provided thereon. The ground electrode 110 extends to the left and right sides of the dielectric layer 102 respectively via extension electrodes 140 and 141. The dielectric layer 101 includes a second capacitor electrode 112 and a third capacitor electrode 113 provided thereon. The second capacitor electrode 112 extends to the right side of the dielectric layer 101 via an extension electrode 142. The third capacitor electrode 113 extends to the right side of the dielectric layer 101 via an extension electrode 143.

A first capacitor is defined by the first capacitor electrode 111 and the ground electrode 110 facing each other. A second capacitor is defined by the second capacitor electrode 112 and the ground electrode 110 facing each other. Similarly, a third capacitor is defined by the third capacitor electrode 113 and the ground electrode 110 facing each other.

The dielectric layer 104 includes a first straight line electrode 121 provided thereon.

The dielectric layer 104 includes a via electrode 132, which is a "vertical conduction electrode" according to a preferred embodiment of the present invention, disposed to extend therethrough. A first end of the first straight line electrode 121 of the dielectric layer 104 is conductively connected to the first capacitor electrode 111 of the dielectric layer 103 using the via electrode 132.

The dielectric layers 104 and 103 include a via electrode 131, which is the "vertical conduction electrode" according to a preferred embodiment of the present invention, disposed to extend therethrough. A second end of the first straight line electrode 121 is conductively connected to the ground electrode 110 of the dielectric layer 102 through the via electrode 131.

The first straight line electrode 121 and the via electrodes 131 and 132 constitute a first coil. The first coil has a winding axis perpendicular or substantially perpendicular to the stacking direction, and defines a loop starting from the connection node of the via electrode 132 and the first capacitor electrode 111 and ending at the connection node of the via electrode 131 and the ground electrode 110. Hence, an LC parallel resonator is defined by the first coil and the first capacitor.

The dielectric layer 104 includes a portion 122 of a second coil and a portion 126 of a third coil provided thereon. The portion 122 of the second coil extends to right side of the dielectric layer 104 via an extension electrode 145. The portion 126 of the third coil extends to the right side of the dielectric layer 104 via an extension electrode 146.

A dielectric layer 105 includes an L-shaped portion 123 of the second coil, an inverted L-shaped portion 125 of the third coil, and a second straight line electrode 124 provided thereon. The portion 123 of the second coil is connected to a first end of the second straight line electrode 124, and the portion 125 of the third coil is connected to a second end of the second straight line electrode 124. As a result, a "C"-shaped loop pattern in plan view when viewed in a direction perpendicular or substantially perpendicular to the main surface of the dielectric layer is provided.

The dielectric layer 105 includes via electrodes 133 and 134, which are the "vertical conduction electrodes" according to a preferred embodiment of the present invention, disposed to extend therethrough. The portion 122 of the second coil of the dielectric layer 104 is connected to the portion 122 of the second coil of the dielectric layer 105 through the via electrode 133. The portion 126 of the third coil of the dielectric layer 104 is connected to the portion 125 of the third coil of the dielectric layer 105 through the via electrode 134. Hence, the second coil having a helical shape is defined by the portion 122 of the second coil and the portion 123 of the second coil being conductively connected to each other. Similarly, the third coil having a helical shape is defined by the portion 126 of the third coil and the portion 125 of the third coil being conductively connected to each other. These second and third coils are preferably configured as loops with winding axes extending in the stacking direction.

The electrodes of the first coil constituted by the first capacitor electrode 111, the via electrode 132, the first straight line electrode, the via electrode 131, and the ground electrode 110, are preferably configured as a loop when viewed in a direction perpendicular or substantially perpendicular to the stacking direction of the stack. The loop plane, having an opening, of this loop of the electrodes is perpendicular or substantially perpendicular to the electrode layers. On the other hand, the loop planes of the second and third helical coils are parallel or substantially parallel to the electrode layers. When currents flow through the first to third coils, magnetic fields are generated around the electrodes. Since the first coil is arranged to extend in the stacking direction of the stack as a loop of electrodes having an opening, a magnetic field is generated which passes through the opening in a direction perpendicular or substantially perpendicular to the stacking direction. On the other hand, in each of the second and third coils, since the opening of the loop of the electrodes is arranged in the stacking direction, a magnetic field is generated which passes through the opening in the stacking direction. In this manner, since the direction of the magnetic field generated by the first coil is perpendicular or substantially perpendicular to the directions of the magnetic fields generated by the second and third coils, the second and third coils have negligible coupling with the first coil.

The first straight line electrode 121 and the second straight line electrode 124, which are arranged in parallel or substantially parallel with each other, are electromagnetically (magnetically, in particular) coupled with each other. The two-dot chain line in FIG. 2 represents a projection of the first straight line electrode 121 on the dielectric layer 105. The gap GAP between the first straight line electrode 121 and the second straight line electrode 124 is set to a predetermined value in accordance with a desired amount of the coupling.

As will be described later, the strength of coupling between the first and second straight line electrodes can be determined by the gap GAP.

The dielectric layers 101 to 106 having various electrode patterns provided thereon are stacked to provide a stack 10 as illustrated in FIG. 3, and on two opposite sides (end surfaces) among the four sides of the stack 10, ground terminals 20, an unbalanced input terminal 21, balanced output terminals 22 and 23, and a non-connection terminal 24 are provided, thereby forming a multilayer balanced filter 11. The approximate dimensions of the bottom surface and the height of the stack 10 preferably are 1.6 mm×0.8 mm and 0.5 mm, for example.

The dielectric portions of the dielectric layers 101 to 106 have relative dielectric constants preferably within a range of 6 to 80. Specifically, the relative dielectric constants of the dielectric layers 102 and 103 that cause capacitance to be generated are equal to or above 20. Each dielectric layer is preferably formed using, for example, a low temperature co-fired ceramic (LTCC) having a relative dielectric constant $\varepsilon r=23.5$ composed of a glass component and at least one of the components such as titanium oxide, barium oxide, and alumina, or may be formed using a resin such as a liquid crystal polymer (LCP) or polyimide. These materials are also used for forming each dielectric layer in other preferred embodiments described later.

Figure 4A:
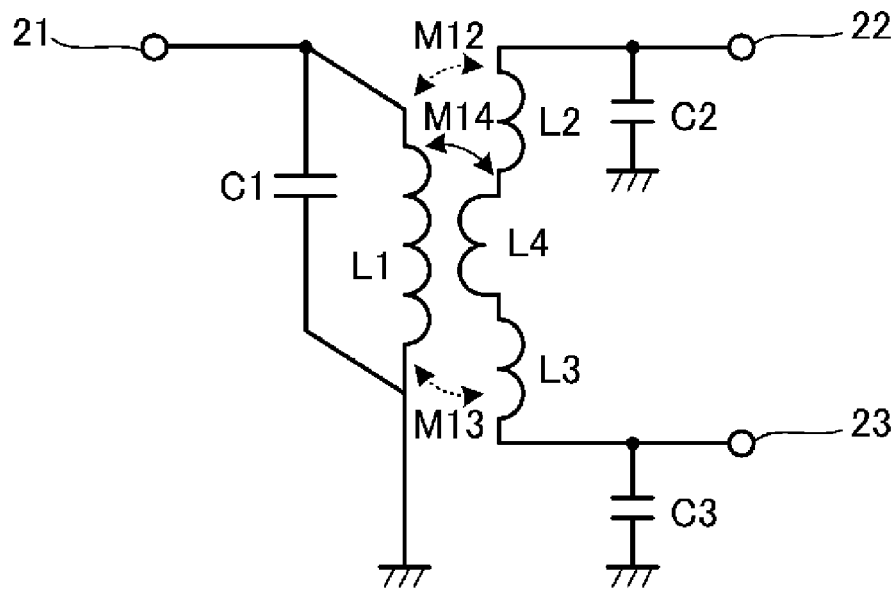
FIGS. 4A and 4B illustrate equivalent circuit diagrams of the multilayer balanced filter illustrated in FIGS. 2 and 3.
Figure 4B:
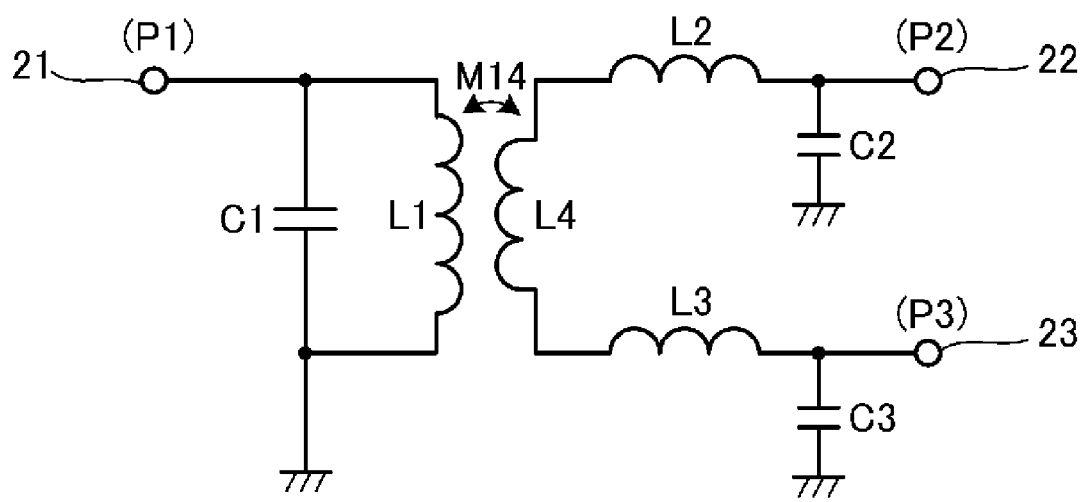

FIGS. 4A and 4B illustrate equivalent circuit diagrams of the multilayer balanced filter illustrated in FIGS. 2 and 3. FIG. 4A illustrates a relatively faithful representation of an equivalent circuit, and FIG. 4B illustrates a simplified equivalent circuit thereof. Referring to FIGS. 4A and 4B, an inductor L1 corresponds to the first coil constituted by the via electrodes 131 and 132 and the first straight line electrode 121 illustrated in FIG. 2. Referring to FIGS. 4A and 4B, an inductor L4 corresponds to the second straight line electrode 124 illustrated in FIG. 2. Referring to FIGS. 4A and 4B, an inductor L2 corresponds to the second coil constituted by the second coils 122 and 123 and the via electrode 133 illustrated in FIG. 2. Similarly, an inductor L3 corresponds to the third coil constituted by the third coils 125 and 126 and the via electrode 134 illustrated in FIG. 2.

Referring to FIGS. 4A and 4B, a capacitor C1 is the first capacitor defined by the first capacitor electrode 111 and the ground electrode 110. Similarly, a capacitor C2 is the second capacitor defined by the second capacitor electrode 112 and the ground electrode 110. Similarly, a capacitor C3 is the third capacitor defined by the third capacitor electrode 113 and the ground electrode 110.

The inductor L1 and the capacitor C1 illustrated in FIGS. 4A and 4B constitute an LC parallel resonator. When the midpoint of the inductor L4 is made to be a virtual ground, half the inductor L4, the inductor L2, and the capacitor C2 constitute an LC parallel resonator. Similarly, half the inductor L4, the inductor L3, and the capacitor C3 constitute an LC parallel resonator.

The coupling coefficient M14 between the inductor L1 and the inductor L4 represents major coupling that enables the operation of a balanced-unbalanced converter. The coupling coefficient M12 between the inductor L1 and the inductor L2, and the coupling coefficient M13 between the inductor L1 and the inductor L2 represent parasitic coupling and are sufficiently smaller than the coupling coefficient M14. Hence, the equivalent circuit is simplified to that illustrated in FIG. 4B. Referring to FIG. 4B, the inductors L2 and L3 are respectively connected in series to the two lines of the balanced output lines. The capacitors C2 and C3 are respectively connected between the ground and the two lines of the balanced output lines. The inductors L2 and L3, and the capacitors C2 and C3 operate as a circuit for impedance matching and conversion.

According to the first preferred embodiment of the present invention, since an LC parallel resonator is preferably provided by connecting the first straight line electrode 121 to the first capacitor electrode 111 and the ground electrode 110 through via electrodes, a resonator having a low conduction loss and a high Q value is provided. Hence, a low-loss passband characteristic is realized. Further, since the LC parallel resonator is provided on the unbalanced input side, the attenuation characteristic outside of the passband is improved. In addition, since the balanced output side includes helical coils, and a capacitor is connected to an end of each of the helical coils, the impedance of the balanced output side can be set within a wide range using the inductances of the helical coils and the capacitances of the capacitors. Further, since the LC parallel resonator including the first coil is coupled with the LC parallel resonators including the second and third coils almost only by the magnetic coupling between the first straight line electrode and the second straight line electrode, adjustment of the coupling between resonators can be made only by adjusting the relative positional relationship of the first straight line electrode and the second straight line electrode. More specifically, the magnetic coupling between the first straight line electrode and the second straight line electrode can arbitrarily be adjusted by changing the respective positions thereof and the thickness of the dielectric layer, whereby optimal electromagnetic coupling and a desired passband width are obtained.

A method of designing the impedance for obtaining appropriate balanced-unbalanced conversion and band pass filter characteristics will now be described with reference to FIGS. 5A1 to 7D.

First, the line width and the line length of the first straight line electrode 121 (inductor L1) illustrated in FIG. 2 corresponding to the inductors L1 and L4 illustrated in FIGS. 4A and 4B preferably are respectively about 0.1 mm and about 0.5 mm, for example. The capacitance of the capacitor C1 illustrated in FIGS. 4A and 4B preferably is about 13 pF, for example. Thereby, the resonance frequency preferably is about 2.45 GHz, and the input impedance preferably is about 50Ω, for example.

The line width and line length of the second straight line electrode 124 (inductor L2) illustrated in FIG. 2 preferably are respectively about 0.1 mm and about 0.5 mm, and the gap between the first straight line electrode 121 and the second straight line electrode 124 preferably is about 0.2 mm, for example.

The graphs illustrated in FIGS. 5A1-5B3 each represent the S21 characteristic (attenuation characteristic) and S11 characteristic (reflection characteristic), which are S-parameter characteristics, when the inductances of the inductors L2 and L3 are changed. The vertical axis shows values in units of decibels with a reference value of 0 dB in all cases.

Figure 1:
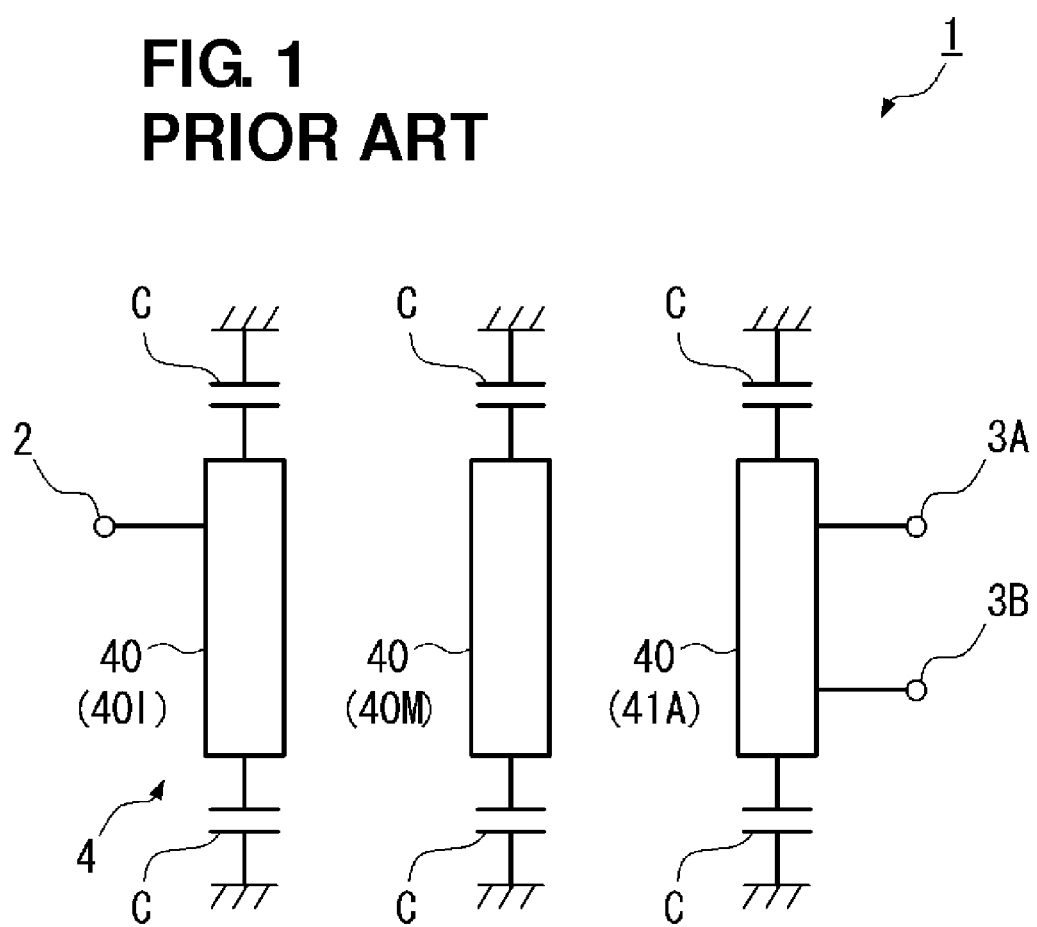
FIG. 1 is a circuit diagram of the multilayer band pass filter disclosed in Japanese Unexamined Patent Application Publication No. 2005-45447.

FIGS. 5A1, 5A2, and 5A3 illustrate changes in the characteristics when the capacitors C2 and C3 have a fixed value of about 4 pF and the values of the inductors L2 and L3 are changed, under the conditions described above. FIG. 5A1 corresponds to the case where L2 and L3=0.5 nH, FIG. 5A2 corresponds to the case where L2 and L3=0.6 nH, and FIG. 5A3 corresponds to the case where L2 and L3=0.7 nH.

On the other hand, FIGS. 5B1, 5B2, and 5B3 illustrate changes in the characteristics when the inductors L2 and L3 have a fixed value of about 0.5 nH and the values of the capacitors C2 and C3 are changed, under the conditions described above. FIG. 5B1 corresponds to the case where C2 and C3=3.5 pF, FIG. 5B2 corresponds to the case where C2 and C3=4.5 pF, and FIG. 5B3 corresponds to the case where C2 and C3=5 pF.

The relationship between the circuit constants of the impedance matching circuit portion and the output impedance Zout is as follows:
(A1) L2, L3=0.5 nH Output impedance Zout=20+j50Ω
(A2) L2, L3=0.6 nH Output impedance Zout=40+j80Ω
(A3) L2, L3=0.7 nH Output impedance Zout=80+j120Ω
(B1) C2, C3=3.5 pF Output impedance Zout=15+j45Ω
(B2) C2, C3=4.5 pF Output impedance Zout=35+j65Ω
(B3) C2, C3=5 pF Output impedance Zout=55+j75Ω

It can be seen from these that the output impedance increases as the inductances of the inductors L2 and L3 increase, and the output impedance increases as the capacitances of the capacitors C2 and C3 increase.

Figure 6A:
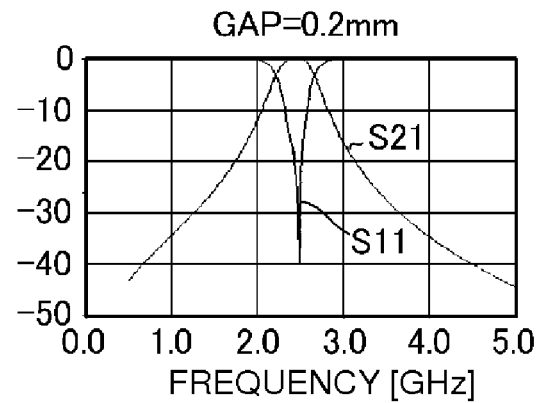
FIGS. 6A-6C illustrate attenuation characteristics and reflection characteristics when the gap GAP between a first straight line electrode 121 and a second straight line electrode 124 is changed.
Figure 6B:
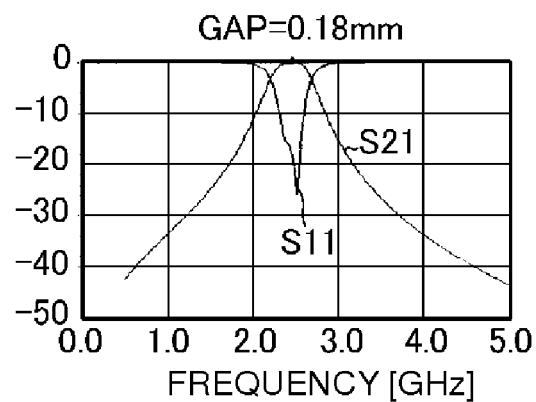
Figure 6C:
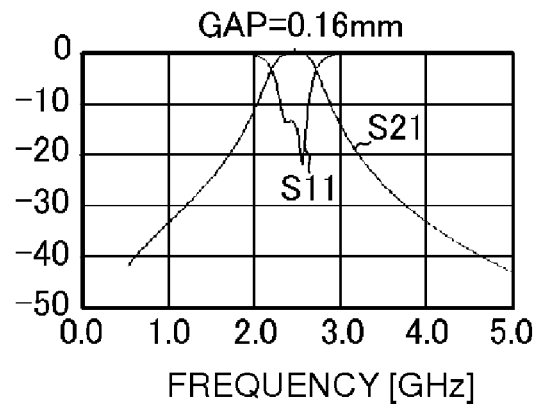

FIGS. 6A-6C illustrates the S21 characteristic (attenuation characteristic) and S11 characteristic (reflection characteristic), which are S-parameter characteristics, when the gap GAP between the first straight line electrode 121 and the second straight line electrode 124 illustrated in FIG. 2 is changed. The vertical axis shows values in units of decibels with a reference value of 0 dB in all cases. In all cases, C1=13 pF, C2 and C3=4 pF, L2 and L3=0.5 nH. FIGS. 6A, 6B, and 6C illustrate examples in which the gaps are about 0.2 mm, about 0.18 mm in, and about 0.16 mm, respectively, for example.

As can be clearly seen from FIGS. 6A-6C, the smaller the gap GAP between the first straight line electrode 121 and the second straight line electrode 124, the wider the passband due to the increase in the coupling coefficient M14 illustrated in FIG. 4B.

Note that the value of GAP may be minus. In other words, the first straight line electrode 121 may be arranged so as to fully or at least partially overlap the second straight line electrode 124 in plan view. Thereby, the coupling coefficient M14 illustrated in FIG. 4B further increases and a wide-passband characteristic is obtained.

FIGS. 7A-7D illustrate various characteristics for the input impedance Zin=50Ω and the output impedance Zout=25+j55Ω realized by the above-described settings of C1, L1, C2, C3, L2, and L3.

Figure 7A:
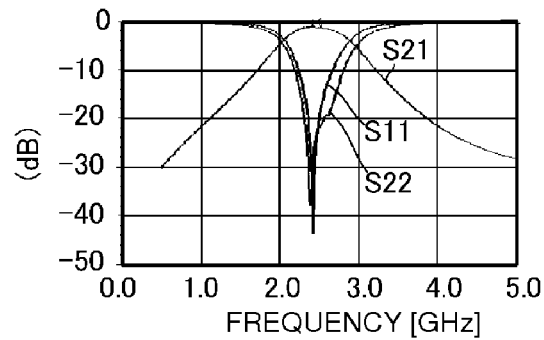
FIGS. 7A-7D illustrate various characteristics for an input impedance Zin=50Ω and an output impedance Zout=25+j55Ω realized by the settings of C1, L1, C2, C3, L2, and L3.
Figure 7B:
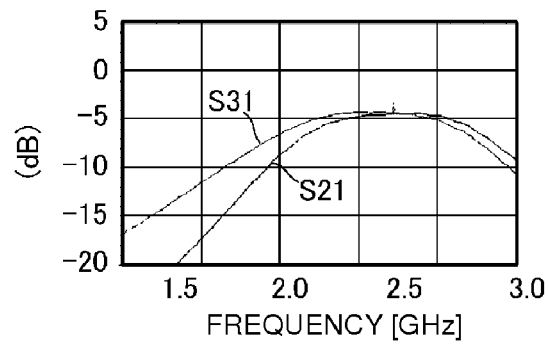
Figure 7C:
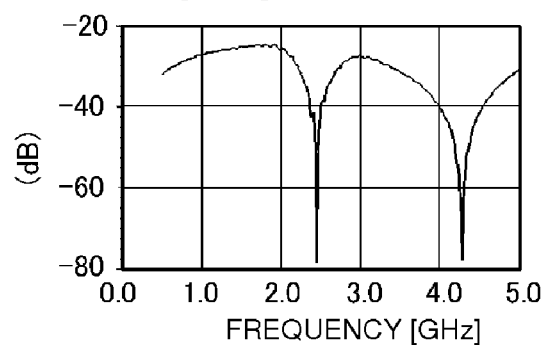
Figure 7D:
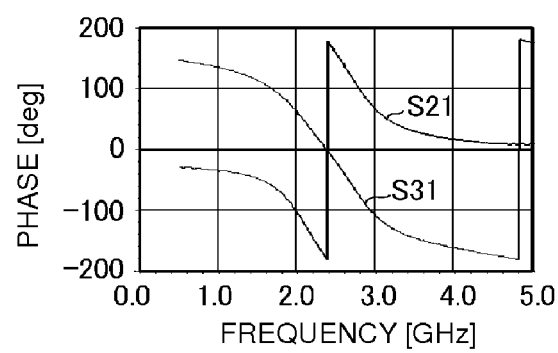

FIG. 7A illustrates the S11 characteristic (input port side reflection characteristic) and the S21 characteristic (insertion loss), which are S-parameter characteristics, of the balanced output ports P2-P3, and the S22 characteristic (output port side reflection loss), of the differential mode. FIG. 7B illustrates the S21 characteristic and the S31 characteristic where the horizontal and vertical axes have been magnified. FIG. 7C illustrates the transmission characteristic of the same-phase component of the balanced output ports P2-P3. The vertical axis shows values in units of decibels with a reference value of 0 dB in all of FIGS. 7A, 7B, and 7C. In FIG. 7D, "S21" illustrates the phase between the ports P1 and P2, and "S31" illustrates the phase between the ports P1 and P3.

The respective port numbers correspond to the ports P1, P2, and P3 illustrated in FIG. 4B.

As illustrated in FIG. 7A, it can be seen that the reflection losses S11 and S22 in a frequency band of 2.45 GHz are small, and impedance matching is realized at the unbalanced input port P1 and the balanced output ports P2 and P3.

As illustrated in FIG. 7B, it can be seen that the reflection losses S21 and S31 in the frequency band of 2.45 GHz are the same, and the output balance at the balanced output ports P2 and P3 is realized.

As illustrated in FIG. 7C, it can be seen that the common mode output of the balanced output ports P2 and P3 is −20 dB or less, showing that the output at the balanced output ports P2 and P3 is sufficiently balanced.

Further, as illustrated in FIG. 7D, it can be seen that, regarding the phase relationship between the balanced output ports P2 and P3, a phase difference of 180 degrees is kept for a wide range of frequencies, and a balanced signal is output across the balanced output ports P2 and P3 for a wide range of frequencies.

Second Preferred Embodiment

A multilayer balanced filter according to a second preferred embodiment will be described with reference to FIGS. 8 to 10.

Figure 8:
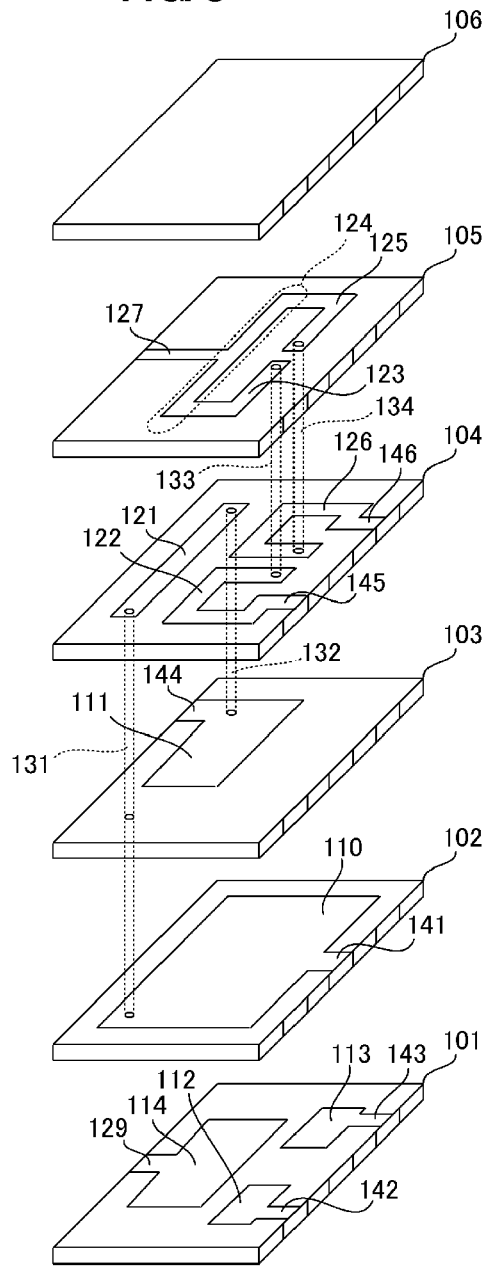
FIG. 8 is an exploded perspective view of a multilayer balanced filter according to a second preferred embodiment of the present invention.
Figure 9:
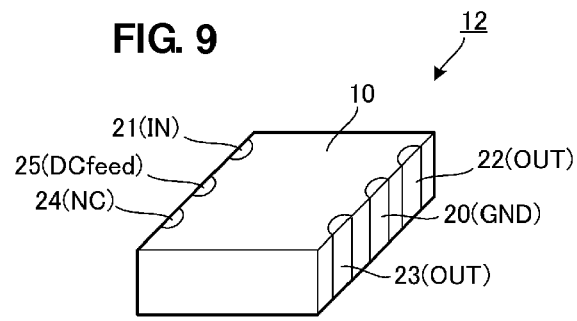
FIG. 9 is an external perspective view of the multilayer balanced filter according to the second preferred embodiment of the present invention.

FIG. 8 is an exploded perspective view of the multilayer balanced filter according to the second preferred embodiment, and FIG. 9 is an external perspective view thereof. The differences from the first preferred embodiment illustrated in FIG. 2 are the configurations of dielectric layers 101, 102, and 105.

Referring to FIG. 8, this multilayer balanced filter is configured as a stack including a plurality of dielectric layers 101 to 106 each having predetermined electrode patterns provided thereon. Hence, this stack is constituted by a stack including dielectric layers and electrode layers.

The dielectric layer 103 includes a first capacitor electrode 111 provided thereon. The first capacitor electrode 111 extends to the left side of the dielectric layer 103 via an extension electrode 144. The dielectric layer 102 includes a ground electrode 110 provided thereon. The ground electrode 110 extends to the right side of the dielectric layer 102 via an extension electrode 141. The dielectric layer 101 include a second capacitor electrode 112, a third capacitor electrode 113, and a fourth capacitor electrode 114 provided thereon. The second capacitor electrode 112 extends to the right side of the dielectric layer 101 via an extension electrode 142. The third capacitor electrode 113 extends to the right side of the dielectric layer 101 via an extension electrode 143. The fourth capacitor electrode 114 extends to the left side of the dielectric layer 101 via an extension electrode 129.

A first capacitor is defined by the first capacitor electrode 111 and the ground electrode 110 facing each other. A second capacitor is defined by the second capacitor electrode 112 and the ground electrode 110 facing each other. Similarly, a third capacitor is defined by the third capacitor electrode 113 and the ground electrode 110 facing each other. In addition, a fourth capacitor is defined by the fourth capacitor electrode 114 and the ground electrode 110 facing each other.

The dielectric layer 105 includes an L-shaped portion 123 of a second coil, an inverted L-shaped portion 125 of a third coil, and a second straight line electrode 124 provided thereon. The portion 123 of the second coil is connected to a first end of the second straight line electrode 124, and the portion 125 of the third coil is connected to a second end of the second straight line electrode 124. As a result, a loop pattern is provided.

On the dielectric layer 105, the middle of the second straight line electrode 124 extends to the left side of the dielectric layer 105 via an extension electrode 127.

The configurations of the remaining dielectric layers are preferably the same as those illustrated in FIG. 2.

The dielectric layers 101 to 106 including various electrode patterns provided thereon are stacked to define a stack 10 as illustrated in FIG. 9, and on two opposite sides (end surfaces) among the four sides of the stack 10, a ground terminal 20, an unbalanced input terminal 21, balanced output terminals 22 and 23, a power feeding terminal 25, and a non-connection terminal 24 are provided, thereby providing a multilayer balanced filter 12.

Figure 10:
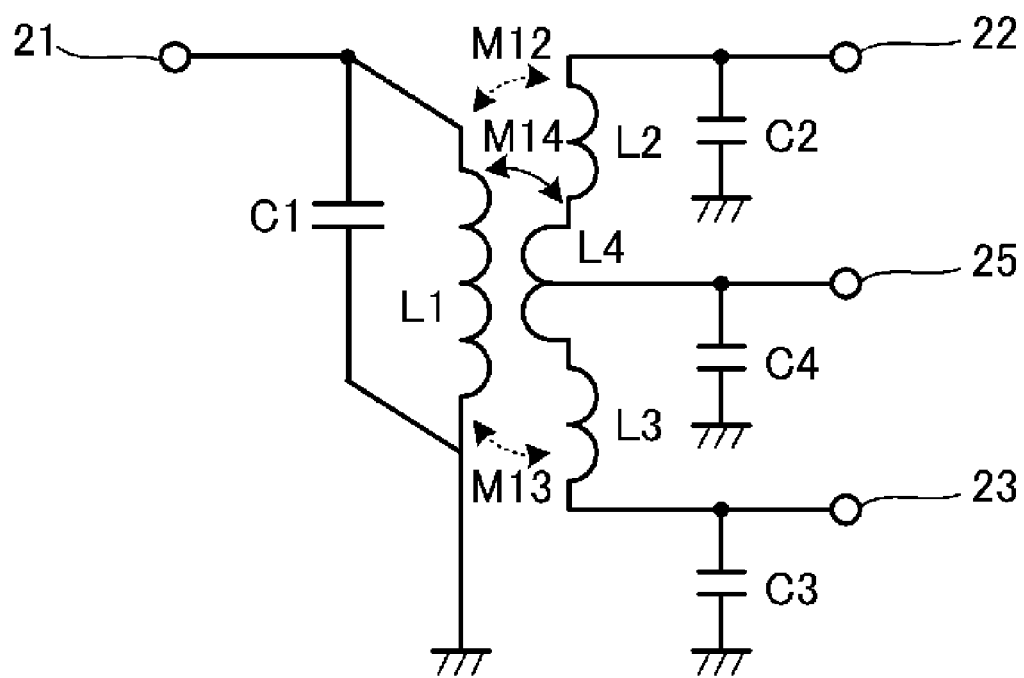
FIG. 10 is an equivalent circuit diagram of the multilayer balanced filter according to the second preferred embodiment of the present invention.

FIG. 10 is an equivalent circuit diagram of the multilayer balanced filter illustrated in FIGS. 8 and 9. In FIG. 10, a capacitor C4 is the fourth capacitor defined by the fourth capacitor electrode 114 and the ground electrode 110. The rest of the configuration preferably is similar to that of the multilayer balanced filter according to the first preferred embodiment.

The fourth capacitor C4 is connected between the power feeding terminal 25 and the ground, and operates as a filter for suppressing high frequency noise. From the power feeding terminal 25, a bias voltage can be applied to an operational amplifier circuit (IC chip) connected to the balanced output terminals 22 and 23.

Third Preferred Embodiment

A multilayer balanced filter according to a third preferred embodiment will be described with reference to FIGS. 11 and 12.

Figure 11:
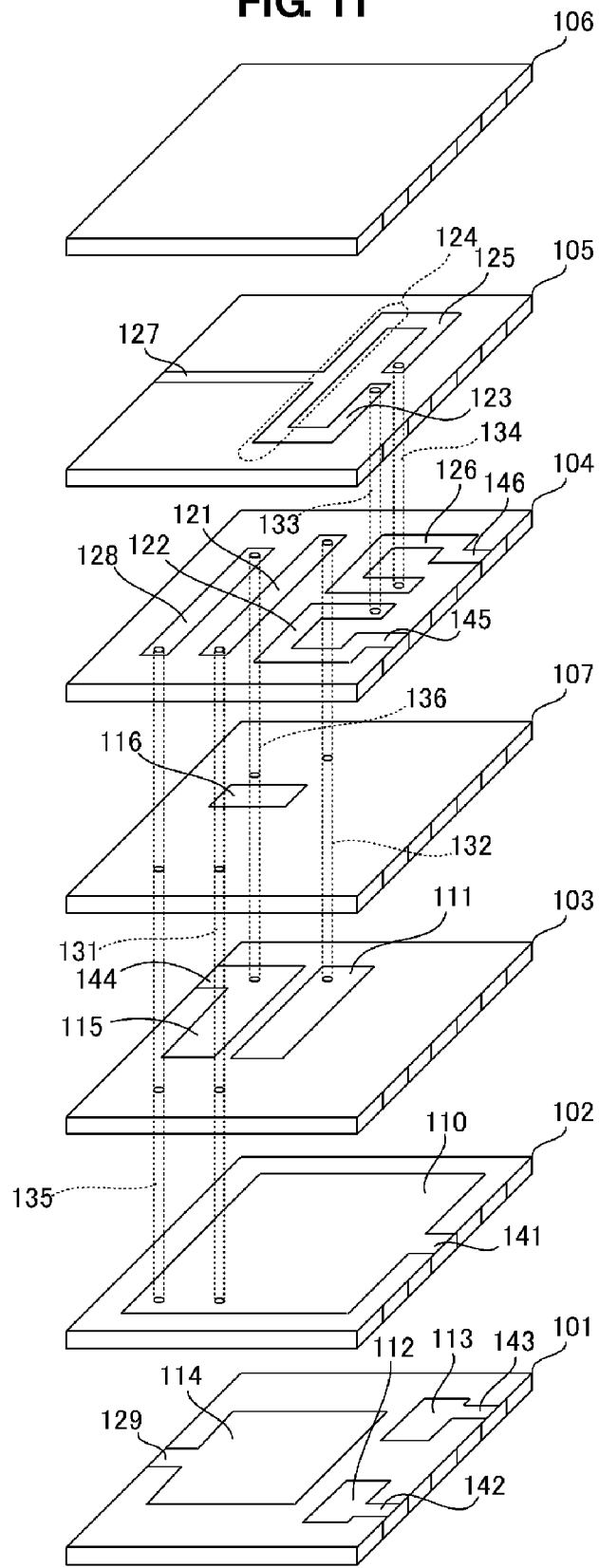
FIG. 11 is an exploded perspective view of a multilayer balanced filter according to a third preferred embodiment of the present invention.
Figure 12:
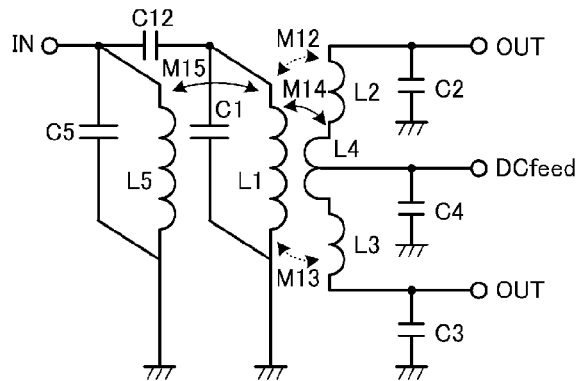
FIG. 12 an equivalent circuit diagram of the multilayer balanced filter according to the third preferred embodiment of the present invention.

FIG. 11 is an exploded perspective view of the multilayer balanced filter according to the third preferred embodiment, and FIG. 12 is an equivalent circuit diagram thereof. The difference from the multilayer balanced filter of the second preferred embodiment illustrated in FIG. 8 is that a dielectric layer 107 is provided between a dielectric layer 103 and a dielectric layer 104.

The dielectric layer 103 includes a first capacitor electrode 111 and a fifth capacitor electrode 115 provided thereon. The fifth capacitor electrode 115 extends to the left side of the dielectric layer 103 via an extension electrode 144. A dielectric layer 102 includes a ground electrode 110 provided thereon. The ground electrode 110 extends to the right side of the dielectric layer 102 via an extension electrode 141. A dielectric layer 101 includes a second capacitor electrode 112, a third capacitor electrode 113, and a fourth capacitor electrode 114 provided thereon. The second capacitor electrode 112 extends to the right side of the dielectric layer 101 via an extension electrode 142. The third capacitor electrode 113 extends to the right side of the dielectric layer 101 via an extension electrode 143. The fourth capacitor electrode 114 extends to the left side of the dielectric layer 101 via an extension electrode 129.

A first capacitor is defined by the first capacitor electrode 111 and the ground electrode 110 facing each other. A second capacitor is defined by the second capacitor electrode 112 and the ground electrode 110 facing each other. Similarly, a third capacitor is defined by the third capacitor electrode 113 and the ground electrode 110 facing each other. In addition, a fourth capacitor is defined by the fourth capacitor electrode 114 and the ground electrode 110 facing each other.

The dielectric layer 104 includes a first straight line electrode 121 provided thereon.

The dielectric layer 104, 107 include a via electrode 132 disposed to extend therethrough. A first end of the first straight line electrode 121 of the dielectric layer 104 is conductively connected to the first capacitor electrode 111 of the dielectric layer 103 through the via electrode 132.

The dielectric layers 104, 107, and 103 include a via electrode 131 disposed to extend therethrough. A second end of the first straight line electrode 121 is conductively connected to the ground electrode 110 of the dielectric layer 102 through the via electrode 131.

The first straight line electrode 121 and the via electrodes 131 and 132 constitute a first coil. Hence, an LC parallel resonator is defined by the first coil and the first capacitor.

The dielectric layer 104 includes a third straight line electrode 128.

The dielectric layer 104, 107 include a via electrode 136. A first end of the third straight line electrode 128 of the dielectric layer 104 is conductively connected to the fifth capacitor electrode 115 through the via electrode 136.

The dielectric layers 104, 107, and 103 include a via electrode 135 disposed to extend therethrough. A second end of the third straight line electrode 128 is conductively connected to the ground electrode 110 of the dielectric layer 102 through the via electrode 135.

The third straight line electrode 128 and the via electrodes 135 and 136 constitute a fifth coil. Hence, an LC parallel resonator is defined by the fifth coil and the fifth capacitor.

The dielectric layer 107 includes a capacitor electrode 116 arranged thereon so as to extend from the first capacitor electrode 111 of the dielectric layer 103 to the fifth capacitor electrode 115 in plan view.

The configurations of a portion 122 of a second coil and a portion 126 of a third coil provided on the dielectric layer 104, and the configuration of a dielectric layer 105 preferably are similar to those in the second preferred embodiment illustrated in FIG. 8.

The approximate dimensions of the bottom surface and the height of the stack containing the respective dielectric layers preferably are 2.0 mm×1.25 mm and 0.5 mm, for example.

FIG. 12 is an equivalent circuit diagram of the multilayer balanced filter illustrated in FIG. 11. Referring to FIG. 12, an inductor L5 corresponds to the fifth coil. A capacitor C5 corresponds to the fifth capacitor. A capacitor C12 corresponds to a capacitor defined by the first capacitor electrode 111, the fifth capacitor electrode 115, and the capacitor electrode 116. This configuration causes the two LC parallel resonators of unbalanced side to be electromagnetically coupled with each other.

By providing the LC parallel resonators of unbalanced side in two stages in this manner, the bandwidth can be increased, and the attenuation outside of a passband can also be increased.

Fourth Preferred Embodiment

A multilayer balanced filter according to a fourth preferred embodiment will be described with reference to FIG. 13.

Figure 13:
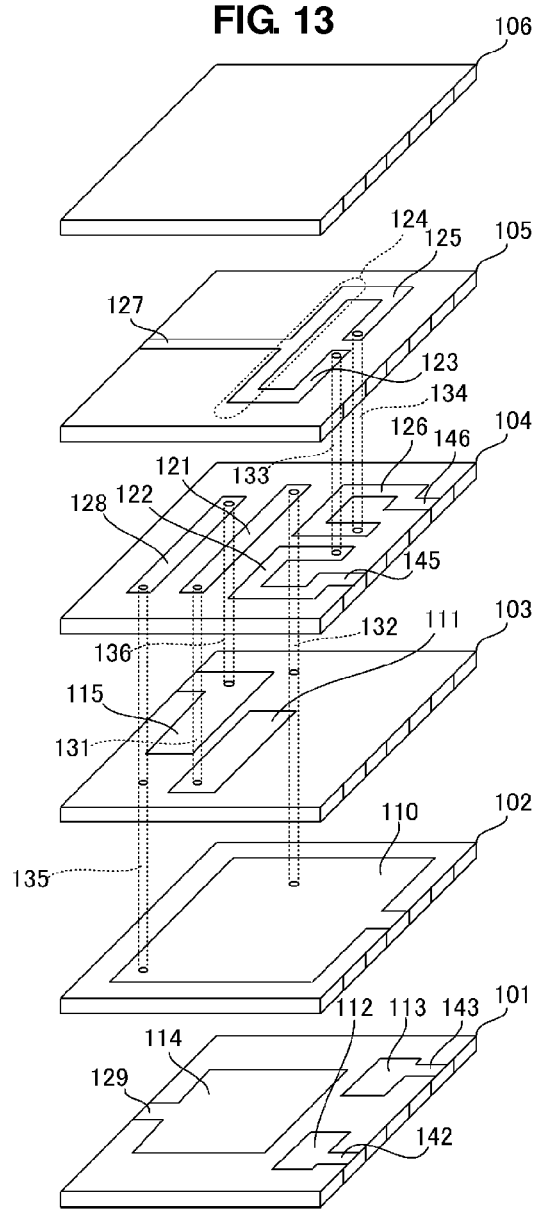
FIG. 13 is an exploded perspective view of a multilayer balanced filter according to a fourth preferred embodiment of the present invention.

FIG. 13 is an exploded perspective view of the multilayer balanced filter according to the fourth preferred embodiment. The difference from the multilayer balanced filter of the third preferred embodiment illustrated in FIG. 11 is that a dielectric layer 107 does not exist between a dielectric layer 103 and a dielectric layer 104.

The dielectric layers 104 and 103 include a via electrode 132 disposed to extend therethrough. A first end of a first straight line electrode 121 of the dielectric layer 104 is conductively connected to a ground electrode 110 of a dielectric layer 102 through the via electrode 132.

The dielectric layer 104 includes a via electrode 131 disposed to extend therethrough. A second end of the first straight line electrode 121 is conductively connected to a first capacitor electrode 111 of the dielectric layer 103 through the via electrode 131.

The first straight line electrode 121 and the electrodes 131 and 132 constitute a first coil. Hence, the first coil and the first capacitor constitute an LC resonator.

The dielectric layer 104 includes a third straight line electrode 128 formed thereon.

The dielectric layer 104 includes a via electrode 136 disposed to extend therethrough. A first end of the third straight line electrode 128 of the dielectric layer 104 is conductively connected to the fifth capacitor electrode 115 of the dielectric layer 103 through the via electrode 136.

The dielectric layers 104 and 103 include a via electrode 135 disposed to extend therethrough. A second end of the third straight line electrode 128 is connected to the ground electrode 110 of the dielectric layer 102 through the via electrode 135.

The third straight line electrode 128 and the via electrodes 135 and 136 constitute a fifth coil. Hence, the fifth coil and the fifth capacitor constitute an LC parallel resonator.

The configurations of a portion 122 of a second coil and a portion 126 of a third coil provided on the dielectric layer 104, and the configuration of a dielectric layer 105 are similar to those in the second preferred embodiment illustrated in FIG. 8.

The equivalent circuit diagram of the multilayer balanced filter illustrated in FIG. 13 is the same as that illustrated in FIG. 12. In the example illustrated in FIG. 13, since the winding directions of the first and fifth coils are opposite to each other, the two LC parallel resonators are capacitively coupled without a capacitor electrode corresponding to a capacitor C12 which causes the two LC parallel resonators to be coupled with each other.

In this manner, since a coupling capacitor is not required, there is no variation in coupling that depends on the processing accuracy, whereby stable characteristics are realized. In addition, since the number of dielectric layers is decreased, the height is reduced.

Although LC parallel resonators in two stages preferably are provided in the third and fourth preferred embodiments, LC parallel resonators may be provided in three or more stages in a similar way.

Fifth Preferred Embodiment

A multilayer balanced filter according to a fifth preferred embodiment will be described with reference to FIG. 14.

Figure 14:
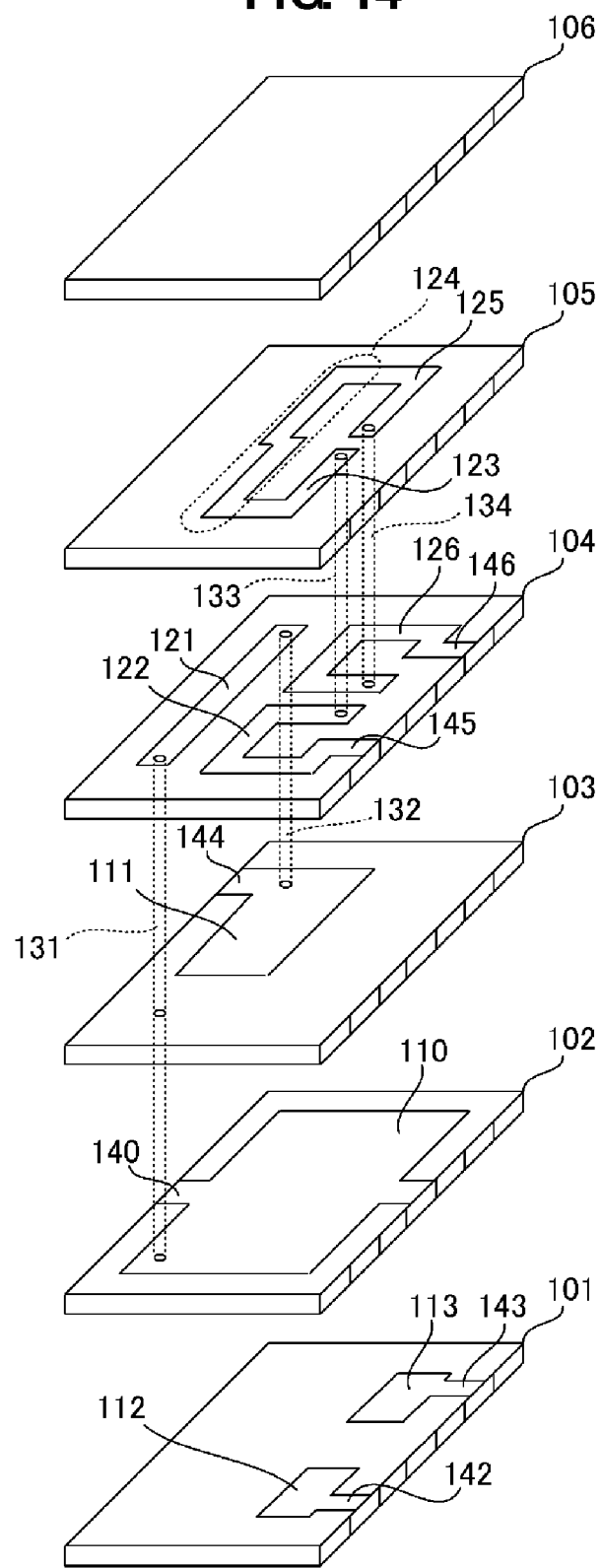
FIG. 14 is an exploded perspective view of a multilayer balanced filter according to a fifth preferred embodiment of the present invention.

FIG. 14 is an exploded perspective view of the multilayer balanced filter according to the fifth preferred embodiment. The difference from the multilayer balanced filter of the first preferred embodiment illustrated in FIG. 2 is the shape of a second straight line electrode 124. In the example illustrated in FIG. 14, a step is provided in the middle of the second straight line electrode 124, such that the distances from a first half and a second half of the second straight line electrode 124 to a first straight line electrode 121 are different from each other.

Since the strength of the coupling between a first coil including the first straight line electrode 121 and the second straight line electrode 124 changes with the distance between the first straight line electrode 121 and the second straight line electrode 124, by making the distances from a first half and a second half of the second straight line electrode 124 to the first straight line electrode 121 different from each other, the balance of the balanced output can appropriately be determined.

The second and third coils, which are circuits on the balanced side, can be configured so as to be line-symmetric; however, in the circuits on the unbalanced side, strictly speaking, a first capacitor electrode 111 and via electrodes 131 and 132 cannot be made to be line-symmetric. Hence, when the balanced output becomes unbalanced, it is effective to realize balance by using the shape of the second straight line electrode as illustrated in FIG. 14.

Note that by providing a step in the middle of the first straight line electrode 121, the distances from a first half and a second half of the first straight line electrode 121 to the second straight line electrode 124 may be made to be different from each other.

Alternatively, the balance of the balanced output may be realized by making the first straight line electrode 121 or the second straight line electrode 124 have a line width which is not uniform but differs between a first half and a second half thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer balanced filter comprising:
a stack including a plurality of electrode layers, a plurality of dielectric layers provided among the plurality of electrode layers, and a plurality of vertical conduction electrodes arranged in a stacking direction of the plurality of electrode layers; wherein
the plurality of electrode layers includes a first straight line electrode and a second straight line electrode that are arranged in parallel or substantially in parallel with each other;
each of the first and second straight line electrodes has a substantially straight-line shape;
first and second vertical conduction electrodes of the plurality of vertical conduction electrodes are respectively connected to first and second ends of the first straight line electrode to define a first coil;
the plurality of electrode layers includes a ground electrode, first capacitor electrode, a second capacitor electrode, and a third capacitor electrode, each of the first, second, and third capacitor electrodes being arranged to face the ground electrode in the stacking direction of the plurality of electrode layers;
each of the first, second, and third capacitor electrodes are disposed on a dielectric layer of the plurality of dielectric layers that is directly adjacent to a dielectric layer of the plurality of dielectric layers on which the ground electrode is disposed;
the ground electrode and the first capacitor electrode define a first capacitor, the ground electrode and the second capacitor electrode define a second capacitor, and the ground electrode and the third capacitor electrode define a third capacitor;
the first vertical conduction electrode connected to the first end of the first straight line electrode is connected to the first capacitor electrode, the second vertical conduction electrode connected to the second end of the first straight line electrode is connected to the ground electrode such that a first LC parallel resonator is defined by the first coil and the first capacitor;
a first end of a second coil is connected to a first end of the second straight line electrode via a third vertical conduction electrode of the plurality of the vertical conduction electrodes, and a first end of a third coil is connected to a second end of the second straight line electrode via a fourth vertical conduction electrode of the plurality of vertical conduction electrodes;
a second end of the second coil is connected to the second capacitor electrode such that a second LC parallel resonator is provided, and a second end of the third coil is connected to the third capacitor electrode such that a third LC parallel resonator is provided; and
the first LC parallel resonator including the first coil is connected to an unbalanced terminal, the second end of the second coil and the second end of the third coil are respectively connected to balanced terminals, the first LC parallel resonator including the first coil defines a loop of electrodes when viewed in a direction perpendicular or substantially perpendicular to the stacking direction of the stack, and each of the second LC parallel resonator including the second coil and the third LC parallel resonator including the third coil defines a loop of electrodes when viewed in the stacking direction of the stack.

2. The multilayer balanced filter according to claim 1, wherein the first straight line electrode and the second straight line electrode are located on different layers.

3. The multilayer balanced filter according to claim 2, wherein the first straight line electrode and the second straight line electrode are arranged such that one overlaps the other at least partially in plan view.

4. The multilayer balanced filter according to claim 1, wherein the plurality of electrode layers includes a power feeding terminal extension electrode connected to the second straight line electrode.

5. The multilayer balanced filter according to claim 1, wherein the ground electrode is arranged between a group of the second and third capacitor electrodes and a group of the second and third coils.

6. The multilayer balanced filter according to claim 1, wherein each of the second coil and the third coil is defined by coil portions respectively provided on a plurality of the electrode layers and a vertical conduction electrode of the plurality of the vertical conduction electrodes, and the second and third coils have opposite winding directions and helical shapes, and are substantially line-symmetrically arranged.

* * * * *